United States Patent
Boerstler et al.

(10) Patent No.: US 7,132,896 B2
(45) Date of Patent: Nov. 7, 2006

(54) CIRCUIT FOR MINIMIZING FILTER CAPACITANCE LEAKAGE INDUCED JITTER IN PHASE LOCKED LOOPS (PPLS)

(75) Inventors: David William Boerstler, Round Rock, TX (US); Eskinder Hailu, Austin, TX (US); Jieming Qi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 45 days.

(21) Appl. No.: 10/981,155

(22) Filed: Nov. 4, 2004

(65) Prior Publication Data

US 2006/0091965 A1    May 4, 2006

(51) Int. Cl.
*H03L 7/093* (2006.01)
*H03L 7/095* (2006.01)
*H03B 1/04* (2006.01)

(52) U.S. Cl. .......................... 331/16; 331/105; 327/157

(58) Field of Classification Search ................. 331/16, 331/17, 105; 327/157
See application file for complete search history.

(56) References Cited

U.S. PATENT DOCUMENTS 5,461,344 A * 10/1995 Andoh ........................ 331/1 A
6,538,518 B1 * 3/2003 Chengson ..................... 331/17
6,963,232 B1 * 11/2005 Frans et al. ................. 327/156

* cited by examiner

*Primary Examiner*—Robert Pascal
*Assistant Examiner*—James Goodley
(74) *Attorney, Agent, or Firm*—Carr LLP; Diana R. Gerhardt

(57) ABSTRACT

A method, an apparatus, and a computer program are provided to minimize filter capacitor leakage in a Phased Locked Loop (PLL). In high frequency processors and devices, filter leakage currents can cause substantial problems by causing PLLs to drift out of phase lock. To combat the leakage currents, a dummy filter and other components are employed to provide additional charge or voltage to a low pass filter during lock. The provision of the charge or voltage exponentially decreases the rate of decay of voltage across the low pass filter caused by leakage currents.

21 Claims, 4 Drawing Sheets

CIRCUIT FOR MINIMIZING FILTER CAPACITANCE LEAKAGE INDUCED JITTER IN PHASE LOCKED LOOPS (PPLS)

FIELD OF THE INVENTION

The present invention relates generally to Phased Locked Loops (PLLs) and, more particularly, to reducing leakage current across low pass filters of PLLs in high frequency systems.

DESCRIPTION OF THE RELATED ART

PLLs can be an integral component of systems that use clocking for various operations. These systems can include microprocessors, wireless/wireline transceivers, and other devices known to those of skill in the art. Generally, PLLs are used to generate an output waveform which has a timing relationship with an input waveform, such as a 1:1 ratio, a 2:1 ratio, and so on. For instance, an input waveform of 60 Hertz could be inputted into a PLL to generate an output waveform of 120 Hertz. Furthermore, there would be a predefined phase relationship between the input wave and the output wave.

One important element of a PLL is a low pass filter, which typically comprises passive elements, such as capacitors and resistors. In a PLL, the voltage on the LPF is used as an input signal to a voltage controlled oscillator (VCO). Therefore, the voltage on the capacitor should remain stable, so that a stable oscillation occurs within the PLL, thereby leading to a stable output frequency.

Often, metal oxide semiconductors (MOSs) can be used as capacitors within a PLL. For instance, the gate and the source, or the gate and the drain, of a MOS can be used within an integrated circuit as the cathode and anode of a capacitor. However, with the rapid advancement of CMOS technology and the resulting reduction of the gate oxide thickness, a regime is being entered wherein the effect of leakage current through the gate dielectric is a problem.

There are two major regimes pertaining to gate leakage in metal-oxide-semiconductor (MOS) devices. These regimes are the Fowler-Nordheim regime and the direct tunneling regime. In the Fowler-Nordheim regime, which is dominant for thick (greater than 50 angstrom) oxides, tunneling is a two-step process. In the first phase, in the presence of a large electric field, carriers at the oxide-semiconductor interface are accelerated. This increases the energy of the carriers (the carriers become hot) such that the barrier they encounter is reduced from trapezoidal to triangular. The tunneling current for the Fowler-Nordheim regime is proportional to the below equation:

$$I \alpha E_{ox}^2 \exp(-B[1-(1-qV_{ox}/C)^{1.5}/E_{ox}) \quad (1)$$

wherein $E_{ox}$ is the electric field strength across the gate oxide/dielectric, which is dependent on the potential ($V_{ox}$) across the MOS capacitor, and B is a constant.

In the direct tunneling regime, the oxide is thin enough for carriers to directly tunnel across the trapezoidal barrier. The current in the direct tunnel regime is proportional to the following equation:

$$I \alpha E_{ox}^2 \exp(-B[1-(1-qV_{ox}/C)^{1.5}/E_{ox}) \quad (2)$$

wherein $E_{ox}$ is the electric field across the gate oxide/dielectric, q is the electric charge in coulombs, $V_{ox}$ is the voltage across the capacitor dielectric, and B and C are constants. In both of the above equations, the leakage current is exponentially dependent on the voltage across the capacitor.

Generally, the leakage current through the capacitor is exponentially dependent upon the voltage across, as well as the thickness of, the gate dielectric. That is, as the thickness of the gate dielectric gets smaller, the leakage current increases exponentially. Also, increasing the voltage across the capacitor will result in an exponential increase in leakage current.

One trend in device technology is for thinner gate dielectrics to help achieve higher performance. However, the penalty for this is the associated exponential increase in leakage current.

In a PLL, the effect of capacitance leakage on PLL performance can be most noticeable when the PLL is in the locked state (that is, there is a determined relationship between the input phase and the output phase of the waveforms) and the capacitor is not being charged by either charge pump, what is otherwise referred to as a high Z state. Suppose, just before the PLL locks, the voltage at Node X in FIG. 1 is set to a voltage value V. Once the PLL is locked, the charge pumps are both disconnected, but for stable operation, the voltage at Node X should also remain stable. However, due to gate leakage of the large MOS device which is used as a capacitor, the voltage at Node X decays to ground with a time constant that is determined by the effective resistance associated with the tunneling current as well as the value of the capacitance. In some cases, the low pass filter cap is not too leaky. In other words, the time duration over which the discharging takes place is large enough that the resulting jitter will have most of its spectral components within the PLL loop bandwidth. As a result, this jitter is not filtered out.

One conventional solution to minimize this effect is to add a resistor in parallel with the low pass filter capacitor between Node X of FIG. 1 and electrical ground. If this added resistor has a value smaller than the effective resistance associated with the tunneling current in the filter capacitor, the resulting jitter at Node X will have its spectrum pushed out to higher frequencies. However, the addition of this resistor reduces the effective dominant pole frequency of the PLL, thereby reducing PLL bandwidth. So, one faces the tradeoff of lowered PLL bandwidth with reduced leakage induced jitter.

In the time domain, this resistor can be considered as making the LPF capacitor more leaky, thereby pushing the center of the spectral distribution of the jitter at Node X to a higher frequency, which can subsequently be filtered out. However, while long-term jitter is filtered out, the output of the VCO can suffer from substantial cycle-to-cycle jitter.

Therefore, there is a need to minimize jitter due to leaky filter capacitors that avoids at least some of the trade offs between loop bandwidth and jitter suppression.

SUMMARY OF THE INVENTION

The present invention provides a method, an apparatus and a computer program for minimizing filter capacitor leakage-induced jitter in a Phased Locked Loop (PLL). As with normal operation of PLL, the PLL attempts to achieve phase and frequency lock with a reference clocking signal. During these periods in and out of phase/frequency lock, a determination is made to see if the PLL is in lock. When not locked, capacitors in the dummy filter are charged. Then when in frequency lock, the capacitors in the dummy filter are discharged to exponentially slow the rate of decay of the voltage across the Low Pass Filter as a result of current leaks.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electromagnetic signaling techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or some combinations thereof. In a preferred embodiment, however, the functions are performed by a processor such as a computer or an electronic data processor in accordance with code such as computer program code, software, and/or integrated circuits that are coded to perform such functions, unless indicated otherwise.

Figure 1:
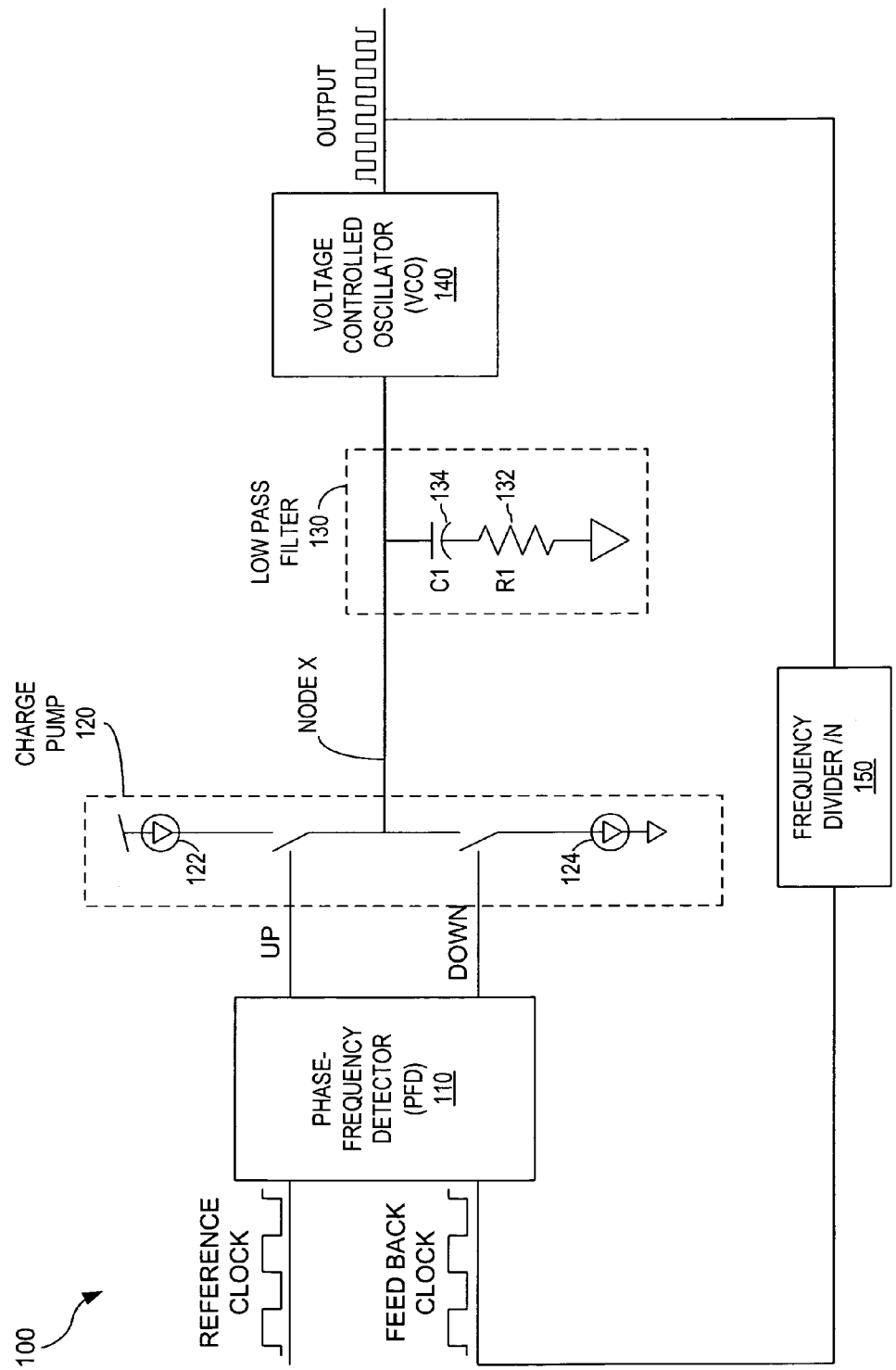
FIG. 1 schematically depicts a conventional phase locked loop circuit.

Turning now to FIG. 1, disclosed is a conventional PLL circuit 100. A phase-frequency detector (PFD) 110 is coupled to a charge pump 120. The charge pump 120 has a current source 122 and current sink 124. The PFD 110 compares the difference between phases of a reference clock frequency and the feedback clock frequency to thereby generate signals to charge the capacitor 134 of the low pass filter 130 through use of the current source 122 or the current sink 124. The voltage on the anode of capacitor 134 is then applied to a voltage controlled oscillator (VCO) 140. The VCO generates an oscillatory output signal at a given frequency as a function of the capacitor 134 voltage. The output of the VCO 140 is then divided in a frequency divider 150, and fed back into the PFD 110.

However, should the charge pumps 120 be turned into the off condition by the PFD 110, there is no replacement of charge at the capacitor 134, as it continues to drain through a resistor 132. Therefore, there would be drift of voltage by the capacitor 134 as charge leaks out of the capacitor 134, which then changes the signal output frequency of the VCO. This changed output is then fed back into the PFD 110, after the frequency divider 150 has processed the changed signal.

The PFD 110 would then alter its output to compensate for this change. This drift of output signal of the VCO 140 could lead to an undesirable oscillation of the output frequency signal.

Figure 2:
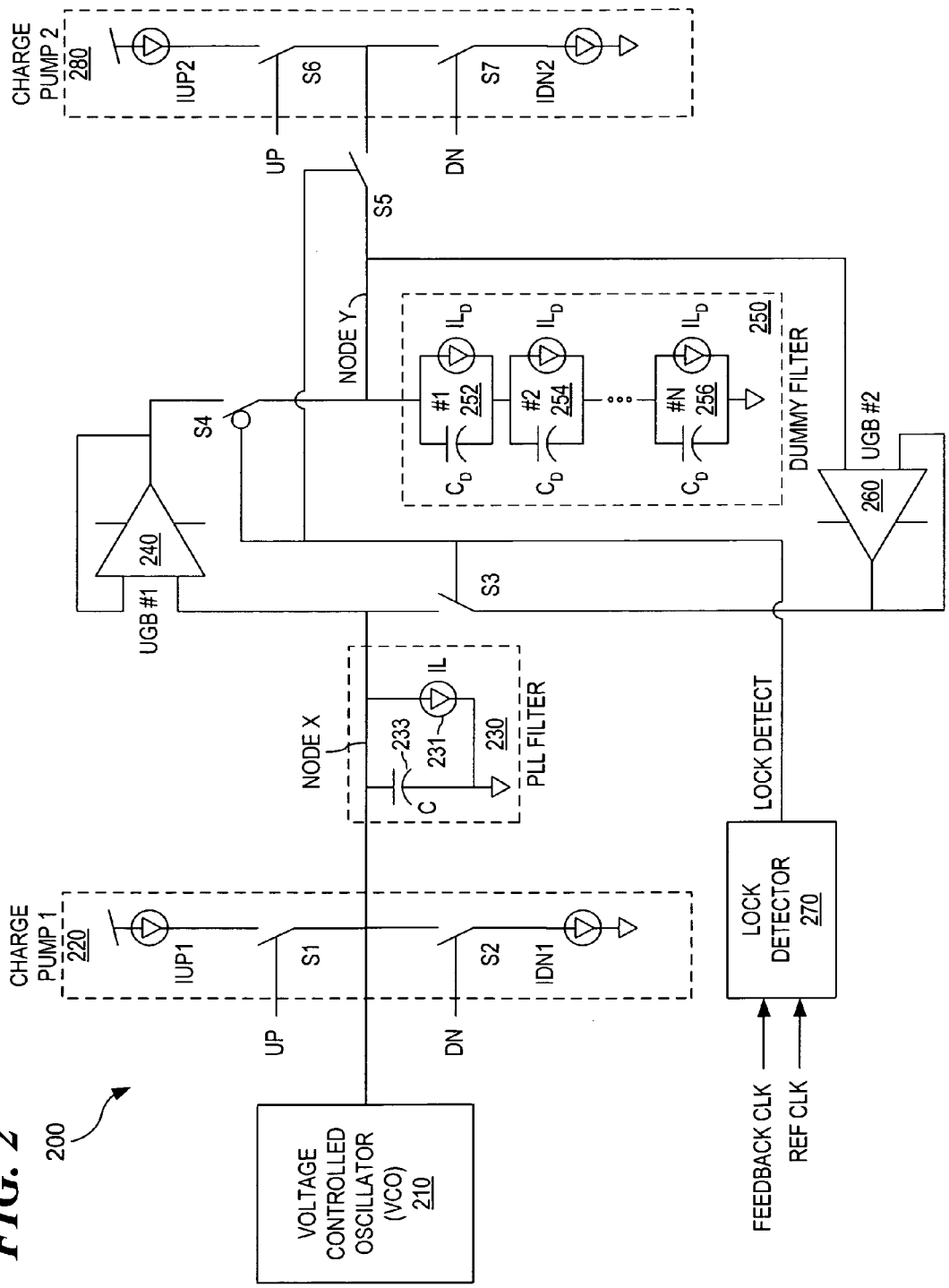
FIG. 2 illustrates a first circuit for use with a PLL having a dummy capacitor comprising a series of smaller capacitors.
Figure 4:
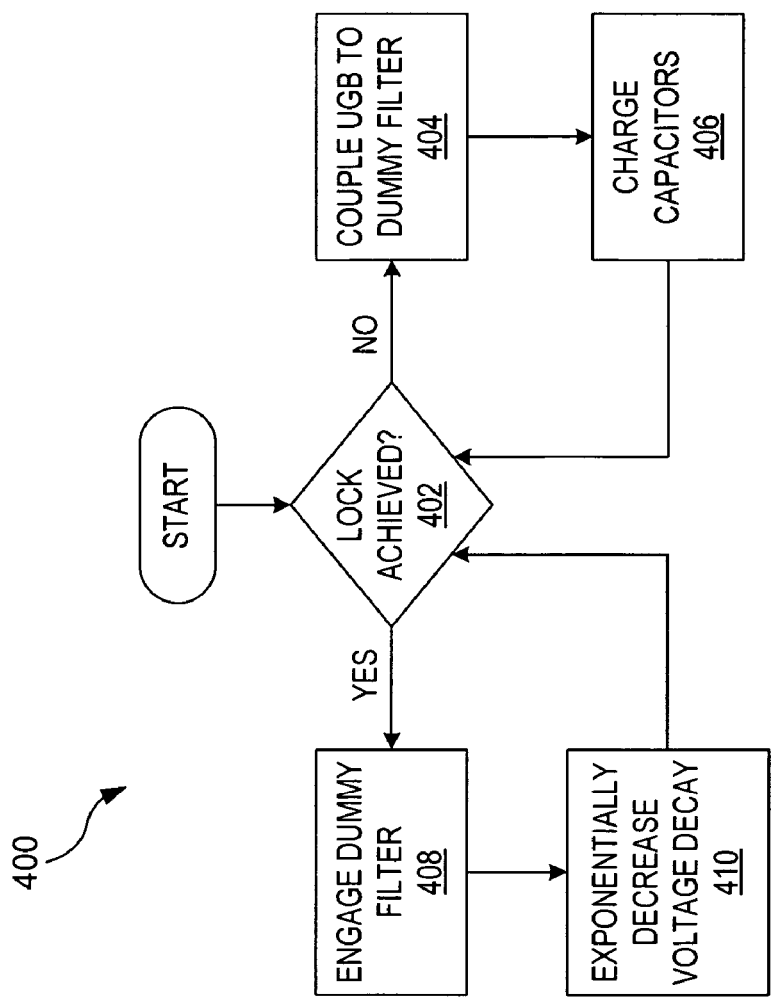
FIG. 4 illustrates an architectural view of the first and second circuits generally.

Turning to FIGS. 2 and 4, illustrated are a circuit 200 and general method of operation 400. A VCO 210 is coupled to a charge pump 220. The charge pump 220 has a first switch S1 coupled to the current source IUP1, and the charge pump 220 has a second switch S2, which acts as enabling a current drain, IDN1. The charge pump 220 is coupled to a PLL filter 230, which has a capacitor 233 and an equivalent leakage current 231. The anode of the PLL filter 230 is coupled to an input of a first unity gain buffer (UGB) 240. The anode of the PLL filter 230 is also coupled to a switch S3. The output of the UGB 240 is coupled to the second input of the UBG 240 and to a switch, S4. Both switches S3, S4 are coupled to a lock detector 270. The lock detector 270 has input into it a feedback clock signal, and a reference clock signal.

The circuit 200 also has a dummy filter 250 coupled to S4. The dummy filter 250 has two or more capacitors 252, 254 and 256, each with its associated leakage current coupled in series. The last capacitor is coupled to ground. The anode of the dummy capacitor series 250 is coupled to an input of the unity gain buffer 260. The output of the UGB 260 is output of the S3 switch. For typical applications, the aggregate size of dummy filter 250 is a fraction of that of PLL filter 230. This reduces the area consumed by the individual capacitors 252 through 256 in the dummy filter 250.

The charge pump 220 is used to set the appropriate potential value on PLL filter 230 (node X) to get a particular PLL 100 frequency behavior. The current sources IUP1 and IDN1 in the charge pump are turned on and off via switches S1 and S2, respectively. S1 and S2 are controlled by signals UP and DN, respectively. UP and DN are generated by the phase-frequency detector (PFD) 110 as in FIG. 1. The circuit 200 employs the two unity gain buffers (UGB 240 and UGB 260), a lock detector 270, and two additional switches (S3 and S4) coupled to the output of the UGB 240 and UGB 260.

The lock detector 270 takes in REF CLK and FEEDBACK CLK, as illustrated in FIG. 2, and then generates the appropriate logical value to tell whether the PLL 100 has reached locked condition, as shown in step 402 of FIG. 4. For ease of illustration, the locked condition corresponds to a "1" and the unlocked condition corresponds to a "0".

For the purpose of the description of the circuit, in one embodiment the capacitor 233 in PLL filter 230 and the capacitors 252–256 in dummy filter 250 are equal. However, this is not a necessary condition for the explanation that follows. For ease of illustration, initially the PLL 100 is out of lock. The PFD 110 is actively driving the charge pump 220 and depositing/extracting charges on node X to drive the circuit 100 towards the locked condition. Also, while the locked condition is not achieved, node LOCK DETECT output from the lock detector 270 is low. Hence S4 is closed. Therefore, the UGB 240 will drive node Y to equal node X in steps 402 and 404. During this lock process, S3 is open. Eventually the PLL 100 achieves lock. For ease of illustration, the voltage at node X (and therefore node Y) at the instant lock is achieved is termed Vlock. At this point, charge pump 1 is in the high "Z" state. In other words, in the high "Z" state, both S1 and S2 are either off or on simultaneously. Also node LOCK DETECT is now high. This opens S4 and closes S3 and S5. Similarly, charge pump 2 can be left on or be disabled with the lock detector 270. However, charge pump 2 is used only when phase lock is achieved; therefore, charge pump 2 remains isolated from the rest of the circuit otherwise.

At the instant lock is achieved, both node X and node Y are at Vlock. The voltage across the capacitor in the PLL filter 230 is also equal to Vlock. However, since there are n capacitors connected in series in 'Dummy filter' 250, the voltage across each capacitor 252–256, assuming they are matched, is equal to Vlock/n.

Regarding equations (1) and (2), the leakage current in a given capacitor is exponentially dependent on the voltage across the capacitor. If IL 231 is the leakage current in the PLL filter 230, the leakage current in the dummy filter 250 will then be $\beta(IL)^{(1/n)}$. $\beta$ is usually less than 1. Hence in the absence of any feedback, node X will discharge much faster than node Y.

In the absence of feedback, during the locked condition, the ratio of the voltage decay rate of node X to node Y (assuming all capacitors are identical, and $\beta=1$) is equal to:

$$X/Y = IL^{(1-1/n)} \quad (3)$$

Where IL 231 is the leakage current density corresponding to the case where the voltage across the capacitor 233 is Vlock, and n is the number of series connected capacitors 252–256 in the dummy filter 250.

In conventional technology, some typical IL 231 values are in the order of ~1000 A/m². For n=3, the ratio in equation (3) will be equal to 100. In other words, the voltage at node Y is decaying at a rate that is 2 orders of magnitude smaller than that at node X. When LOCK DETECT is high, S3 is on. Therefore, UGB 260 will now force the voltage at node X to follow node Y in step 408. Effectively, the discharge rate of node X is now to equal that of node Y in step 410.

The circuit 200 can help minimize low pass filter leakage-induced jitter on PLL output. It uses the stacking of capacitors in a dummy filter to exponentially reduce the voltage decay rate. Furthermore, the matching constraints on the stacked dummy capacitors are relaxed since the exponential reduction in leakage current is a measurement of importance. This can be achieved even if there is a large mismatch in the stacked capacitor values.

Figure 3:
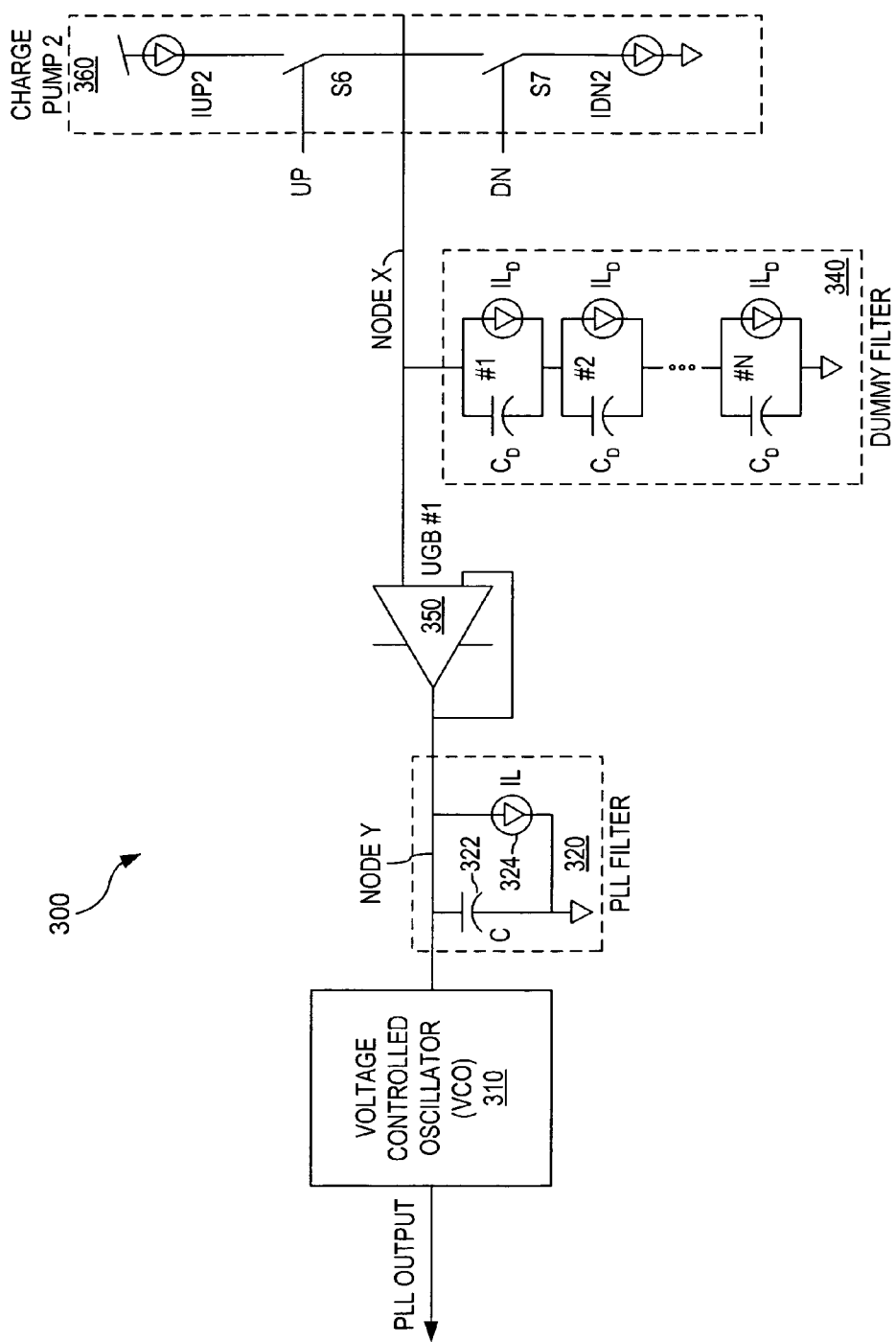
FIG. 3 illustrates a second circuit for use with a PLL having a dummy capacitor comprising a series of smaller capacitors.

Turning to FIGS. 3 and 4, illustrated are a circuit 300 and method of operation 400. A VCO 310 is a PLL filter 320, which has a capacitor 322 and an equivalent leakage current 324. The anode of the PLL filter 320 is coupled to an output of a unity gain buffer 350. The PLL filter 320 is also coupled to the second input of the UGB 350.

The circuit 300 of FIG. 3 works as follows. The phase frequency detector (not shown) will generate the UP/DN signals, which will drive CHARGE PUMP 2 360. CHARGE PUMP 2 360 in turn drives the DUMMY FILTER 340 at node X. Node Y is then made equal to node X via the unity gain buffer UGB 350. The rate of charge leakage (voltage decay) at node Y as well as node X is determined by the rate of charge leakage in the DUMMY FILTER 340. Since the DUMMY FILTER 340 consists of a chain of capacitors, its effective leakage current is much lower than that of a stand-alone capacitor. However, the circuit in figure 3 as shown has serious drawbacks. The cascade of DUMMY FILTER 340, UGB 350, and PLL FILTER 320 in FIG. 3 will reduce the band width of the PLL as opposed to the case where the CHARGE PUMP 2 360 is directly driving the PLL FILTER 320. This will degrade the transient performance of the PLL. (A reduced bandwidth results in increased 'lock in' time.)

The circuit 200 of FIG. 2 eliminates this problem. While the PLL is not locked switch S5 is open and therefore CHARGE PUMP 2 280 is not involved in the 'lock in' process. Only CHARGE PUMP 1 220 along with PLL filter will determine how fast lock is achieved. Once the PLL is locked switch S5 is closed. Hence, CHARGE PUMP 2 280 is allowed to take part in the loop. During the locked condition CHARGE PUMP 2 280 will set the voltage at node Y which will subsequently set the voltage at node X via UGB 260. Notice that loop bandwidth in this case is the same as that of FIG. 3, such as the loop bandwidth in the locked state is smaller than that of the unlocked state. However, the bandwidth reduction only takes place once the PLL has achieved lock. Additionally, during the locked state, reduced bandwidth is sufficient to maintain the locked condition.

It is understood that the present invention can take many forms and embodiments. Accordingly, several variations may be made in the foregoing without departing from the spirit or the scope of the invention. The capabilities outlined herein allow for the possibility of a variety of programming models. This disclosure should not be read as preferring any particular programming model, but is instead directed to the underlying mechanisms on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

The invention claimed is:

1. An apparatus for minimizing filter capacitor leakage-induced jitter in a phased locked loop (PLL), comprising:
   a voltage controlled oscillator (VCO);
   at least one charge pump (CP);
   a low pass filter (LPF);
   a dummy filter comprised of a plurality of capacitors in series;
   a first switch and a second switch, wherein the second switch is at least configured to be coupled to the dummy filter, and wherein the first switch is at least configured to be coupled to the LPF;
   a first unity gain buffer (UGB) and a first UGB, wherein the first UGB is at least configured to be interconnected between the second switch and the LPF, and wherein the second UGB is at least configured to be interconnected between the first switch and the second switch;
   a lock detector having a lock detect output signal having a first and a second state;
   the first and the second switches are responsive to the output signal to alternatively interconnect the first UGB to the dummy filter and the second UGB to the LPF during the first state, and to disconnect the first UGB from the dummy filter in order to interconnect the second UGB and the dummy filter during the second state.

2. The apparatus of claim 1, wherein the apparatus further comprises the VCO, the at least one CP, the LPF, and the dummy filter being interconnected in series and in order.

3. The apparatus of claim 1, wherein each capacitor of the plurality of capacitors of the dummy filter have values that are substantially equal to one another.

4. The apparatus of claim 1, wherein the aggregate size of the plurality of the capacitors of the dummy filter are a fraction of the size of a filter capacitor in the LPF.

5. An apparatus for minimizing filter capacitor leakage-induced jitter in a PLL having an LPF, comprising:
a dummy filter;
a plurality of UGBs; and
a lock detector having a first state and a second state, wherein during the first state a first UGB of the plurality of UGBs is coupled to the dummy filter and a second UGB of the plurality of UGBs is coupled to the LPF, and wherein during the second state the second UGB of the plurality of UGBs is coupled to the dummy filter.

6. The apparatus of claim 5, wherein the dummy filter comprises a plurality of capacitors in series.

7. The apparatus of claim 6, wherein each capacitor of the plurality of capacitors have values that are substantially equal to one another.

8. The apparatus of claim 5, wherein the apparatus further comprises:
a VCO
at least one CP
wherein the VCO, the at least one CP, the LPF, and the dummy filter are interconnected in series and in order.

9. The apparatus of claim 5, wherein the aggregate size of the plurality of the capacitors of the dummy filter are a fraction of the size of a filter capacitor in the LPF.

10. A method for minimizing filter capacitor leakage-induced jitter in a PLL having an LPF, comprising:
determining whether the PLL is in lock;
if the PLL is not in lock, coupling a first UGB of a plurality of UGBs to a dummy filter to charge a plurality of capacitors in the dummy filter; and
if the PLL is in lock, coupling a second UGB of the plurality of UGBs to the dummy filter and coupling the first UGB to the LPF to exponentially slow the rate of decay of the voltage across the LPF.

11. The method of claim 10, wherein each capacitor of the plurality of capacitors have values that are substantially equal to one another.

12. The method of claim 10, wherein the aggregate size of the plurality of the capacitors of the dummy filter is a fraction of the size of a filter capacitor in the LPF.

13. The method of claim 10, wherein the step of determining whether the PLL is in lock comprises:
receiving a feedback clock signal at a lock detector;
receiving a reference clock signal at the lock detector; and
outputting a lock detect signal from the lock detector.

14. The method of claim 10, wherein the step of coupling a first UGB of a plurality of UGBs to a dummy filter to charge a plurality of capacitors in the dummy filter, further comprises:
engaging at least one switch with output from a lock detector; and
employing the first UGB by engaging the at least one switch to drive the voltage across the dummy filter to at least be a fraction of the voltage across the LPF.

15. The method of claim 10, wherein the step of coupling a second UGB of the plurality of UGBs to the dummy filter and coupling the first UGB to the LPF to exponentially slow the rate of decay of the voltage across the LPF, further comprises:
engaging at least one switch with output from a lock detector; and
taking current from the dummy filter by at least one switch.

16. A processor for minimizing filter capacitor leakage-induced jitter in a PLL having an LPF, the processor including a computer program comprising:
computer code for determining whether the PLL is in lock;
computer code for, if the PLL is not in lock, coupling a first UGB of a plurality of UGBs to a dummy filter to charge a plurality of capacitors in the dummy filter; and
computer code for, if the PLL is in lock, coupling a second UGB of the plurality of UGBs to the dummy filter and coupling the first UGB to the LPF to exponentially slow the rate of decay of the voltage across the LPF.

17. The computer program of claim 16, wherein each capacitor of the plurality of capacitors have values that are substantially equal to one another.

18. The computer program of claim 16, wherein the aggregate size of the plurality of the capacitors of the dummy filter is a fraction of the size of a filter capacitor in the LPF.

19. The computer program of claim 16, wherein the computer code for determining whether the PLL is in lock comprises:
computer code for receiving a feedback clock signal at a lock detector;
computer code for receiving a reference clock signal at the lock detector; and
computer code for outputting a lock detect signal from the lock detector.

20. The computer program of claim 16, wherein the computer code for coupling a first UGB of a plurality of UGBs to a dummy filter to charge a plurality of capacitors in the dummy filter, further comprises:
computer code for engaging at least one switch with output from a lock detector; and
computer code for employing the first UGB by engaging the at least one switch to drive the voltage across the dummy filter to at least be a fraction of the voltage across the LPF.

21. The computer program of claim 16, wherein the computer code for coupling a second UGB of the plurality of UGBs to the dummy filter and coupling the first UGB to the LPF to exponentially slow the rate of decay of the voltage across the LPF, further comprises:
computer code for engaging at least one switch with output from a lock detector; and
computer code for taking current from the dummy filter by at least one switch.

* * * * *